(12) United States Patent
Rachinsky et al.

(10) Patent No.: US 10,930,359 B2
(45) Date of Patent: Feb. 23, 2021

(54) PROGRAMMABLE READ-ONLY MEMORY HAVING AT LEAST FOUR MEMORY CELLS, EACH HAVING SWITCHING ELEMENT AND DATA STORAGE ELEMENT ARRANGED SO THAT EACH SWITCHING ELEMENT IS CONNECTED TO AT LEAST TWO SELECTION LINES AND THE STORAGE ELEMENTS ARE SHARED BY A DATA LINE

(71) Applicant: X-FAB SEMICONDUCTOR FOUNDRIES GmbH, Erfurt (DE)

(72) Inventors: Rumen Rachinsky, Sofia (BG); Aleksandar Radev, Pleven (BG); Valeri Ivanov, Sofia (BG)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/356,217

(22) Filed: Mar. 18, 2019

(65) Prior Publication Data

US 2019/0287636 A1  Sep. 19, 2019

(30) Foreign Application Priority Data

Mar. 19, 2018  (GB) .................................... 1804353

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
(Continued)

(56) References Cited

U.S. PATENT DOCUMENTS 4,287,571 A  9/1981  Chakravarti et al.
4,387,447 A  6/1983  Klaas et al.
(Continued)

FOREIGN PATENT DOCUMENTS

EP  0169332  5/1985
EP  2784818  10/2014

OTHER PUBLICATIONS

Combined Search Report and Examination Report dated Jun. 21, 2018 in corresponding GB Application No. 1804353.9, 9 pages.

*Primary Examiner* — Connie C Yoha
(74) *Attorney, Agent, or Firm* — Nixon & Vanderhye PC

(57) ABSTRACT

A programmable memory device. The device comprises at least four memory cells, each cell comprising a data storage element connected to a switching element. The device is arranged such that each switching element is connected to at least two selection lines for selecting of at least one of the at least four memory cells. At least one of the four memory cells is selectable by applying a voltage to at least one of the at least two selection lines, such that at least two switching elements share one of the at least two selection lines and one of the at least two switching elements shares another one of the at least two selection lines with another switching element and such that each data storage element is connected to a shared data line for applying a programming or reading voltage to each storage element of the at least four memory cells to allow for programming or reading of the selected memory cell.

20 Claims, 5 Drawing Sheets

(58) Field of Classification Search
USPC .................................................. 365/102, 149
See application file for complete search history.

(56) References Cited

U.S. PATENT DOCUMENTS

| | | | |
|---|---|---|---|
| 5,557,569 A | | 9/1996 | Smayling et al. |
| 5,675,547 A | * | 10/1997 | Koga .................... G11C 11/005 |
| | | | 365/149 |
| 6,798,693 B2 | | 9/2004 | Peng |
| 6,856,540 B2 | | 2/2005 | Peng et al. |
| 7,277,347 B2 | | 10/2007 | Jenne |
| 7,402,855 B2 | | 7/2008 | Kurjanowicz |
| 9,324,424 B2 | * | 4/2016 | Higo .................... G11C 13/003 |
| 10,622,030 B1 | * | 4/2020 | Wang .................. G11C 11/4097 |
| 2003/0063518 A1 | | 4/2003 | Fong et al. |
| 2004/0100822 A1 | * | 5/2004 | Roizin ................ H01L 29/7923 |
| | | | 365/185.03 |
| 2008/0283931 A1 | | 11/2008 | Wada |
| 2010/0244115 A1 | | 9/2010 | Kurjanowicz |
| 2011/0122672 A1 | | 5/2011 | Kodama et al. |
| 2014/0209989 A1 | | 7/2014 | Kurjanowicz |

* cited by examiner

PROGRAMMABLE READ-ONLY MEMORY HAVING AT LEAST FOUR MEMORY CELLS, EACH HAVING SWITCHING ELEMENT AND DATA STORAGE ELEMENT ARRANGED SO THAT EACH SWITCHING ELEMENT IS CONNECTED TO AT LEAST TWO SELECTION LINES AND THE STORAGE ELEMENTS ARE SHARED BY A DATA LINE

This application claims priority to GB Patent Application No. 1804353.9 filed Mar. 19, 2018, the entire contents of which are hereby incorporated by reference.

FIELD

Embodiments described herein relate generally to Programmable Read-Only Memory (PROM) devices suitable for use in One-Time Programmable (OTP) memories.

BACKGROUND

A Non-Volatile Memory (NVM) is a type of memory that retains stored information in the absence of power. There are two groups of NVM: Read-Only Memory (ROM) and Programmable Read-Only Memory (PROM). Information is stored in Read-Only Memory during the manufacturing of the ROM. Users of the ROM cannot change the data stored in the ROM.

In PROMs, in contrast, the user can store information. PROMs in which the user can only store information once are referred to as being One-Time Programmable (OTP). A PROM that can be programmed a number of times is referred to as being Multi-Time Programmable (MTP).

An example of a known single OTP memory cell 100 is shown in FIG. 1. The cell includes a select NMOS transistor M and a gate oxide capacitor C. The upper plate of the capacitor C is connected to a cell pin D. Cell pin D is connected to a data line that, in use when the memory cell is to be programmed or read, carries a programming or reading voltage $V_{pp}$, $V_r$ respectively. The bottom plate of the capacitor C is connected to the drain of the select transistor M. The gate of the select transistor M is connected to a cell pin WL. The cell pin WL is connected to a word line. Application of appropriate voltages to the word line renders the transistor M conductive. The source of select transistor is connected to a cell pin S. The cell pin S is connected to a select line. The bulk SUB of the select transistor M is connected to ground.

A programming voltage Vpp (with Vpp>>Vdd) is applied on the cell pin D respectively on the upper plate of the capacitor C for programming the memory cell 100. At the same time a select voltage Vwl is applied to the cell pin WL while a low voltage Vs (0V or ground) is applied to the cell pin S. The select transistor M will be in "on" state, i.e. is rendered conductive, if Vwl−Vs higher than the transistor's threshold voltage. When the transistor M is conducting a low voltage is applied at the bottom plate of the capacitor C. Further, if the voltage drop across the capacitor is bigger than the capacitor's breakdown voltage a gate oxide burning process will happen, destroying the insulating properties of the gate oxide and establishing a conductive connection between the two plates of the capacitor, thereby programming the memory cell.

In the read mode a read voltage Vr (which may be equal to Vdd) is applied to the cell pin D for reading the cell 100. A select voltage Vwl (normally equal to Vdd) is applied to the cell pin WL respectively to the gate of the select transistor M. A low voltage Vs (0V or ground) is applied to the cell pin S respectively to the source of the select transistor M. If VGS of the select transistor is bigger than its threshold voltage the transistor is "on" and a low voltage is applied on the bottom plate of the capacitor C. The current through the cell pin D respectively via the capacitor C depends on its gate oxide resistivity. By measuring the current flowing through the cell the programming state of the memory cell can therefore be determined.

BRIEF DESCRIPTION OF THE DRAWINGS

The present invention will be understood and appreciated more fully from the following detailed description taken in conjunction with drawings in which.

DETAILED DESCRIPTION

Figure 1:
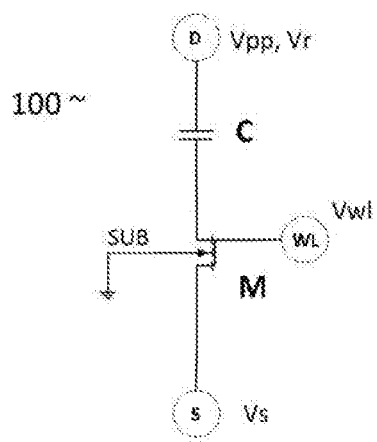
FIG. 1 shows a known single OTP memory cell.

According to one embodiment there is provided a programmable memory device. The device comprises at least four memory cells, each cell comprising a data storage element connected to a switching element. The device is arranged such that each switching element is connected to at least two selection lines for selecting at least one of the at least four memory cells. At least one of the four memory cells is selectable by applying a voltage to at least one of the at least two selection lines, such that at least two switching elements share one of the at least two selection lines and one of the at least two switching elements shares another one of the at least two selection lines with another switching element and such that each data storage element is connected to a shared data line for applying a programming or reading voltage to each storage element of the at least four memory cells to allow for programming or reading of the selected memory cell.

In an embodiment two of the at least two selection lines extend in respective first and second directions. The first and second directions are substantively perpendicular.

In an embodiment the storage element and the switching element define a longitudinal axis, wherein said longitudinal axis extends at an angle relative to the one or more or all of the select lines and the common data line, wherein the angle is an angle other than an integer multiple of 90°. Arranging the storage element and the switching element so that their longitudinal axis extends relative to the one or more or all of the select lines allows maximising the distance between conductive components of the memory cell arrangements in those sections in which the components are not required to be close to each other. This in turn reduces parasitic capacitances within the arrangement and decreases access time. Preferably the angle is about 45°. The four memory cells may in particular be arranged in an X-shaped configuration.

According to one embodiment there is provided a programmable memory arrangement that comprises first and second programmable memory devices. These memory devices are as described above and are arranged side by side in a first direction. The first and second programmable memory devices share select lines that extend in a second direction. The first and second directions are different.

A third one of the above described programmable memory devices may additionally be provided. This third programmable memory device can be arranged side by side in the second direction with the first programmable memory device. In this configuration the first and third programmable memory devices share the common data line.

A select voltage source configured to apply voltages to the select lines may further be provided. The device is arranged to select a memory cell by the select voltage source applying a first voltage to one of the at least two selection lines connected to the switching element of a memory cell to be selected and a second voltage to the other one of the at least two selection lines connected to the switching element of the memory cell to be selected.

The select voltage source may be configured to apply a third voltage to one of at least two selection lines that is shared by two other switching elements wherein one of the two other switching elements being arranged to share the other of the at least two selection lines connected to the switching element of the memory cell to be selected.

The first voltage may be smaller than the second voltage and/or the third voltage is equal to or larger than the second voltage.

In an embodiment a data line voltage source configured to apply a programming or reading voltage to the shared data line is further provided.

Each switching element may comprise a transistor. A gate of the transistor may be connected to one of the at least two selection lines and a source of the transistor may be connected to another of the at least two selection lines.

Each data storage device may comprise a capacitive element connected between the shared data line and a drain of the transistor.

According to another embodiment there is provided a programmable memory device, the device comprising a pair of select lines extending in a first direction, a common data line extending in a second direction and at least four memory cells, each cell comprising a data storage element connected to a switching transistor having a gate, each gate connected to a said select line. Each data storage element is directly connected to the shared data line. The shared data line is for applying a programming or reading voltage to each storage element of the at least four memory cells. The first direction is different from the second direction.

According to another embodiment there is provided a method of programming or reading any of the above described devices. The method comprises applying a voltage to at least one of the at least two selection lines of the device to select at least one memory cell and applying a voltage to the shared data line to program or read the selected memory cell.

The known memory cell 100 shown in FIG. 1 occupies a relatively large amount of die space. This is undesirable, given that the memory cell 100 is merely one memory cell in a large array of memory cells with high density.

The burning of the gate oxide in the memory cell 100 requires relatively high current, for example 600 µA. To minimise parasitic resistance the quality of substance contacts in the array needs to be good and distances to the contacts need to be short. This helps to avoid possible bipolar effects and suppresses power line noise. If there is no space for a substrate contact in the memory cell 100 layout the contact has to be placed outside of the memory cell. This leads to an additional memory area increase.

Figure 2:
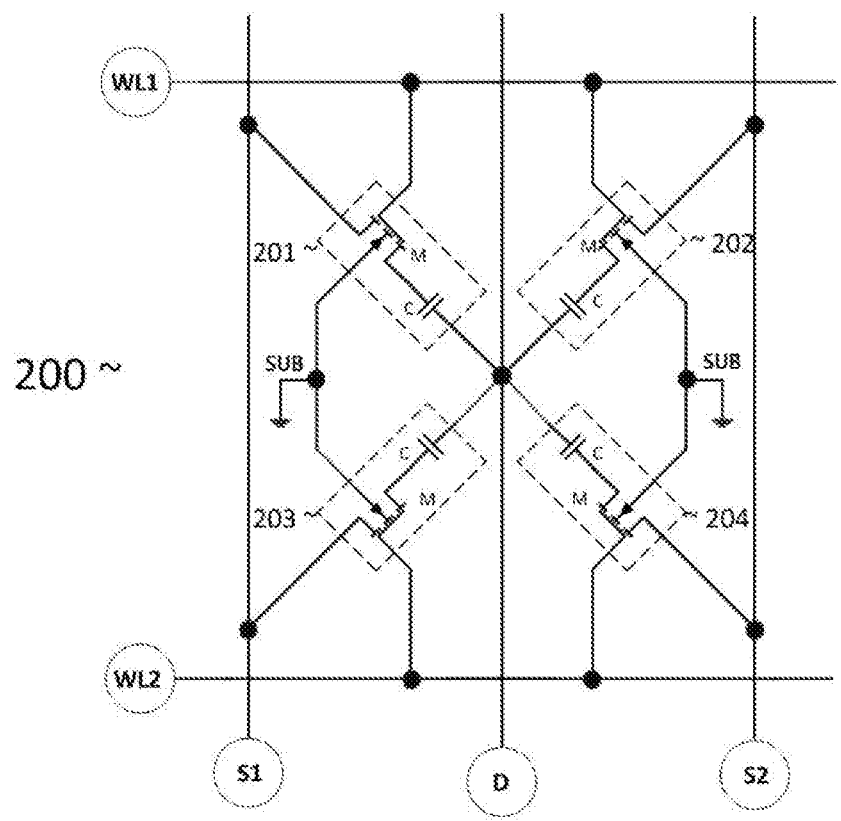
FIG. 2 shows a schematic of a PROM device according to an embodiment.

FIG. 2 shows a schematic of a PROM device 200 according to an embodiment. The PROM device 200 comprises of four single OTP memory cells 201, 202, 203 and 204 placed in two rows and two columns. Each of the memory cells 201, 202, 203 and 204 comprises a storage element and a switching element. In the embodiment the storage element is a gate oxide capacitor and the switching element a transistor. As will become clear in the following, the switching element isolates the storage element from a voltage applied to the select lines $S_1/S_2$. To allow reading or programming of a memory cell the switching element needs to be rendered conductive, so that a voltage applied to the select line $S_1/S_2$ is applied to the terminal of the storage element that is in contact with the switching element. For this reason the transistor that forms the switching element in the embodiment is referred to as a select transistor in some instances. Each memory cell can store one bit of data so that the PROM device shown in FIG. 2 can store four bits. The four memory cells share a common pin D, i.e. a common upper capacitor plate. The bits 201 and 202 in the upper row share a common pin WL1 connected to the correspondent select transistor gates. Respectively a common pin WL2 is connected to the correspondent select transistor gates of the bits 203 and 204 in the bottom row. The bits 201 and 203 in the left column share a common pin S1 connected to the correspondent select transistor sources. Respectively a common pin S2 is connected to the correspondent select transistor sources of the bits 202 and 204 in the right column. Each one of the four bits in the PROM device can be selected by a logic combination of the signals applied on WL1, WL2, S1 and S2 for programming or read.

Table 1 shows the logical states that need to be applied to lines WL1, WL2, S1 and S2 respectively to select the individual memory cells 201, 202, 203 and 204 of the PROM device. '1' in the table means a high logic level (power supply or Vdd) and '0' means a low logic level (ground, Vss or 0V). In programming or read mode only one of the four memory cells 201, 202, 203 and 204 is selected. For example memory cell 201 can be selected when WL1='1', WL2='0', S1='0' and S2='1'; memory cell 202 can be selected when WL1='1', WL2='0', S1='1', S2='0', etc.

TABLE 1

|  | Memory Cell 201 | Memory Cell 202 | Memory Cell 203 | Memory Cell 204 |
| --- | --- | --- | --- | --- |
| WL1 | 1 | 1 | 0 | 0 |
| WL2 | 0 | 0 | 1 | 1 |
| S1 | 0 | 1 | 0 | 1 |
| S2 | 1 | 0 | 1 | 0 |

Programming Memory Cells in Embodiments:

Table 2 shows the voltages applied to those pins D, WL and S connected to respective memory cells 201, 202, 203 and 204 to allow programming of the memory cell 201 in the PROM device shown in FIG. 2.

TABLE 2

|  | D | WL | S | Switching state of the transistor | programming |
|---|---|---|---|---|---|
| Memory Cell 201 | D = Vpp | WL1 = Vdd | S1 = 0 V | 'on' | enabled |
| Memory Cell 202 | D = Vpp | WL1 = Vdd | S2 = Vdd | 'off' | disabled |
| Memory Cell 203 | D = Vpp | WL2 = 0 V | S1 = 0 V | 'off' | disabled |
| Memory Cell 204 | D = Vpp | WL2 = 0 V | S2 = Vdd | 'off' | disabled |

In the programming mode a voltage Vpp is applied on the common pin D. It can be seen from the table that only the select transistor of the memory cell 201 is 'on' because only its gate-source voltage (Vwl−Vs) is positive and higher than its threshold. In this way only memory cell 201 is selected for programming. The potential at the bottom capacitor plate of 201 is low and the voltage across the selected capacitor gate oxide is near to Vpp at this moment. If Vpp is higher than the capacitor breakdown voltage a permanent conductive connection bridges the gate oxide, programming memory cell 201. If the unselected memory cells are not programmed yet the voltage drop across their capacitor will be low and a gate oxide breakdown will not happen in memory cells 202, 203 and 204. If one of the unselected memory cells 202, 203 and 204 had previously been programmed Vpp will be applied through the capacitor oxide short connection to the drain of the correspondent select transistor M which state is 'off'. It is known in the art how to prevent the select transistor breakdown or leakage in this situation. Memory cells 202, 203 and 204 are programmed in the same manner and with reference to the selection voltages/states indicated in Table 1 and the programming voltages shown in Table 2.

Reading Memory Cells in Embodiments:

Table 3 shows the voltages applied to those pins D, WL and S connected to respective memory cells 201, 202, 203 and 204 to allow reading of memory cell 201 in the PROM device shown in FIG. 2.

TABLE 3

|  | D | WL | S | Switching state of the transistor | reading |
|---|---|---|---|---|---|
| Memory Cell 201 | D = Vr | WL1 = Vdd | S1 = 0 V | 'on' | enabled |
| Memory Cell 202 | D = Vr | WL1 = Vdd | S2 = Vdd | 'off' | disabled |
| Memory Cell 203 | D = Vr | WL2 = 0 V | S1 = 0 V | 'off' | disabled |
| Memory Cell 204 | D = Vr | WL2 = 0 V | S2 = Vdd | 'off' | disabled |

In read mode a voltage Vr is applied on the common pin D. It can be seen from the table that only the select transistor of memory cell 201 is 'on' because only its gate-source voltage (Vwl−Vs) is positive and higher than its threshold. In this way only memory cell 201 is selected for reading. The current that flows via pin D (or respectively, the upper plate of all four capacitors of the four memory cells 201, 202, 203 and 204) depends on the resistivity of the capacitor gate oxide of memory cell 201. It is known in the art how to sense the 201 current flowing through pin D/memory cell 201 in read mode.

By using the select setup in Table 1 and the read setup of memory cell 201 in Table 3 it can be easily defined how to read memory cells 202, 203 and 204.

Figure 3:
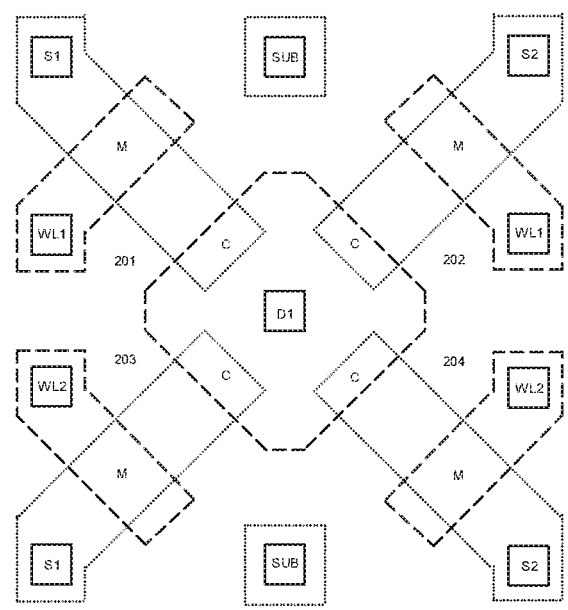
FIG. 3 shows a possible layout of the PROM device shown in FIG. 2.

An example of a layout of the PROM device according to the embodiment of FIG. 2 is shown in FIG. 3. The upper terminal of the four capacitors C is a common polysilicon plate which leaves free space for substrate contacts as shown there. The metal lines connecting S1, S2, WL1, WL2 and SUB are not shown in this figure. The gates of the transistors are formed of individual polysilicon plates that connect to metal lines WL1 and WL2 respectively. The source terminations of the transistors are formed of active areas that connect to metal lines S1 and S2 respectively.

The PROM device allows built-in substrate contacts without increasing its size. This reduces parasitic resistance, avoiding possible bipolar effects and low power line noise.

Figure 4:
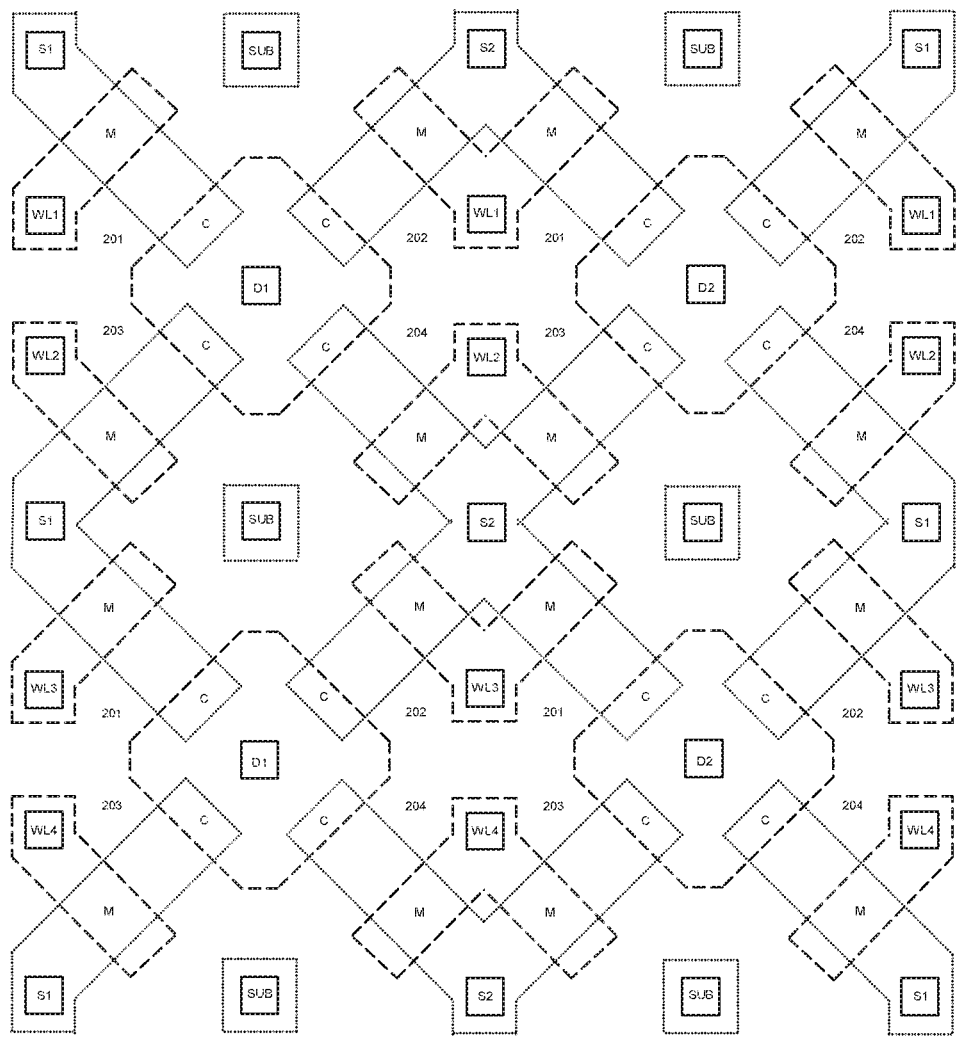
FIG. 4 shows layout of a 2×2 memory array comprising 4 PROM devices, each having the layout shown in FIG. 3.

FIG. 4 illustrates the layout of a 2×2 array of PROM devices having the layout shown in FIG. 3. As can be seen from this figure, in each "cluster" of four memory cells, two memory cells each are connected to the word lines WL1 and WL2 respectively. As can also be seen, however, a select line contact falling in the center of the four clusters of four memory cells (contact S2 in the centre of FIG. 4) each connects to four individual memory cells. This provides the advantage that the number of contacts S required for accessing the memory cells for reading or programming is reduced when compared to an arrangement in which a simple cluster of four memory cells need to be connected to two individual select lines $S_1$ and $S_2$.

It will moreover be appreciated that select lines are shared between adjacent clusters of memory cells. Therefore, instead of having to provide two select lines for each cluster of memory cells a select line connected to one cluster of memory cells is also connected to the immediately neighbouring cluster. The total number of select lines required for N clusters is therefore reduced from 2N select lines to N+1 select lines. This reduction in select lines reduces the amount of die space required for the array. This reduction is made possible by the fact that the select lines extend parallel to the common line D and the selection of cells is facilitated by the perpendicularly extending word lines WL1 and WL2. A low voltage can be applied to one of the select lines S1 and S2 whilst a higher voltage, preferably Vdd is applied to the other one of select lines S1 and S2. A higher voltage is applied to the common line D. Voltages applied to the word lines WL1 and WL2 respectively are such that individual cells are selected in the manner described earlier through the combination of the voltages on the word lines WL1 and WL2 and on the select lines S1 and S2.

Figure 5:
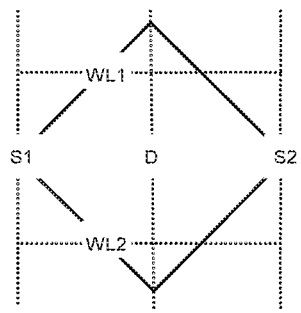
FIG. 5 shows the symbol of a PROM device of an embodiment.

FIG. 5 shows a symbol indicating a PROM device of four memory cells according to the embodiment shown in FIG. 2, with the dotted lines indicating the word lines WL1 and WL2, the select lines S1 and S2 and the common/data line D respectively.

Figure 6:
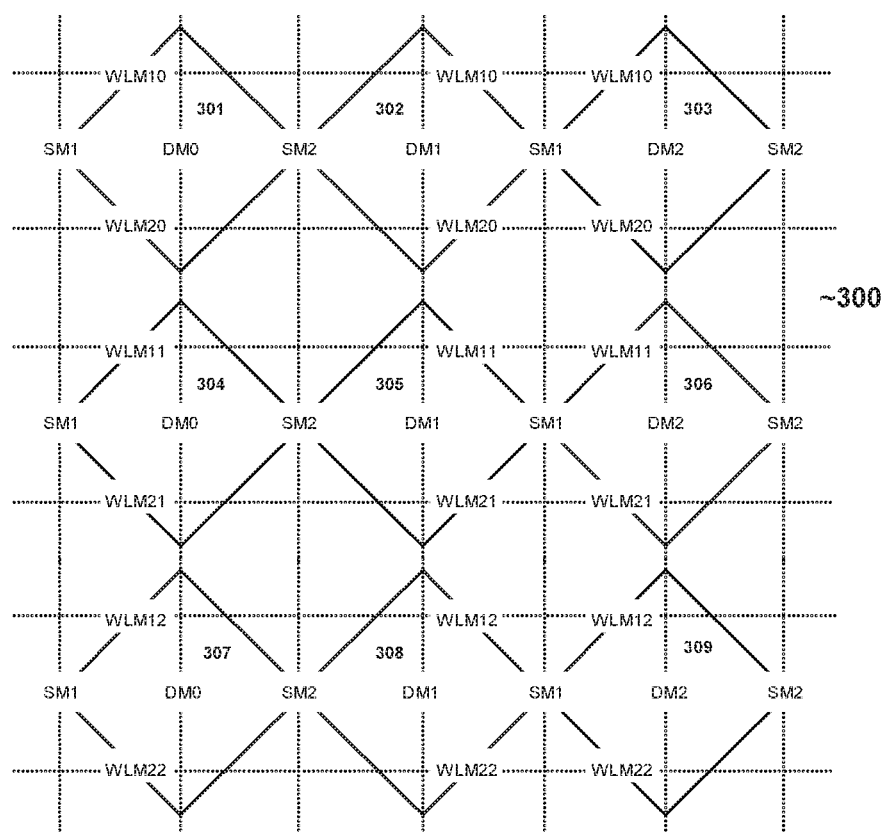
FIG. 6 shows a 3×3 memory array comprising 9 PROM devices according to an embodiment using the symbols shown in FIG. 5.

FIG. 6 shows a 36 bit example 3×3 array with 9 four-cell PROM devices using the symbol introduced in FIG. 5. The X-shape memory array 300 is arranged in a matrix of 3 rows and 3 columns of PROM devices 301 to 309. The matrix has got three pairs of horizontal WLM lines, two groups of vertical source lines SM1 and SM2 and three vertical data lines DM. All vertical source lines in a first group SM1 carry the same potential. All vertical source lines in the other group SM2 carry the same potential. The potential carried on the source lines of group SM1 is different from the potential carried by the source lines of group SM2. In one embodiment in a first switching state the potential carried on the source lines of group SM1 is Vdd while the potential carried by the source lines of group SM2 is 0V. In the embodiment in a second switching state the potential carried on the source lines of group SM1 is 0V while the potential carried by the source lines of group SM2 is Vdd. Each pair WM1*j* and WM2*j* (j=0, 1, 2) is used to select rows in the respective row of PROM devices. The lines SM1 and SM2 are used to select columns in all associated PROM devices. A vertical data line DMi is connected to the pin D of all bits from the correspondent column of PROM devices (i=0, 1, 2).

Programming Mode of the X-Shape OTP Memory Array

Programming is performed "bit by bit", i.e. only a single memory cell is programmed at a given moment.

For example if memory cell 201 in PROM device 301 is to be programmed WLM10 is set to Vdd, WLM20 is set to 0V, SM1 is set to 0V and SM2 is set to Vdd. All others pairs of select lines WLMij are be set to 0V (i=1, 2; j=1, 2). In this way the PROM devices 304 and 307 in the column connected to DM0 are disabled i.e. set to "Low" for programming. A programming voltage Vpp is applied to the data line DM0. The others data lines DMi (i=1, 2) are connected to 0V. In this way the bit 201 from PROM devices 302 and 303 in the row connected to WLM10 are disabled for programming.

In the rest of the unselected PROM devices (305, 306, 308 and 309) the programming is disabled because DMi (i=1, 2) is set to 0V and WLMij (i=1, 2; j=1, 2) is also set to 0V.

Memory cells 202, 203 and 204 in PROM device 301 can be programmed in a similar way by using the select setup in Table 1.

Bits in PROM devices 302 and 303 in the same row can be programmed in a similar way by applying programming voltage Vpp on the correspondent DMi (i=1, 2).

Bits in PROM devices 304 and 307 in the same column can be programmed in a similar way by applying Vdd on WLM1*j* or WLM2*j* (j=1, 2).

Read Mode of the X-Shape OTP Memory Array

In contrast to the programming operation used in the array shown in FIG. 6 data can be read in parallel from memory cells located in the same row/connected to the same word line WLM of the PROM devices, For example, if information is to be read from all memory cells 201 of the first row of devices (301, 302, 303) WLM10 is set to Vdd and WLM20 is set to 0V. All other WLMij (i=1, 2; j=1, 2) are set to 0V.

A read voltage Vr (normally=Vdd) is applied to all data lines DMi (i=0, 1, 2). The select line SM1 is set to 0V and SM2 is set to Vdd. The select transistors M of bit 201 in PROM devices 301, 302 and 303 are 'on' and the bit currents can be sensed at DMi (i=0, 1, 2).

Memory cells 202, 203 and 204 in PROM devices 301, 302, 303 can be read in a similar way by using the select setup in Table 1.

Memory cells in PROM devices in the other rows can be read in a similar way by applying Vdd on WLM1*j* or WLM2*j* (j=1, 2).

Figure 7:
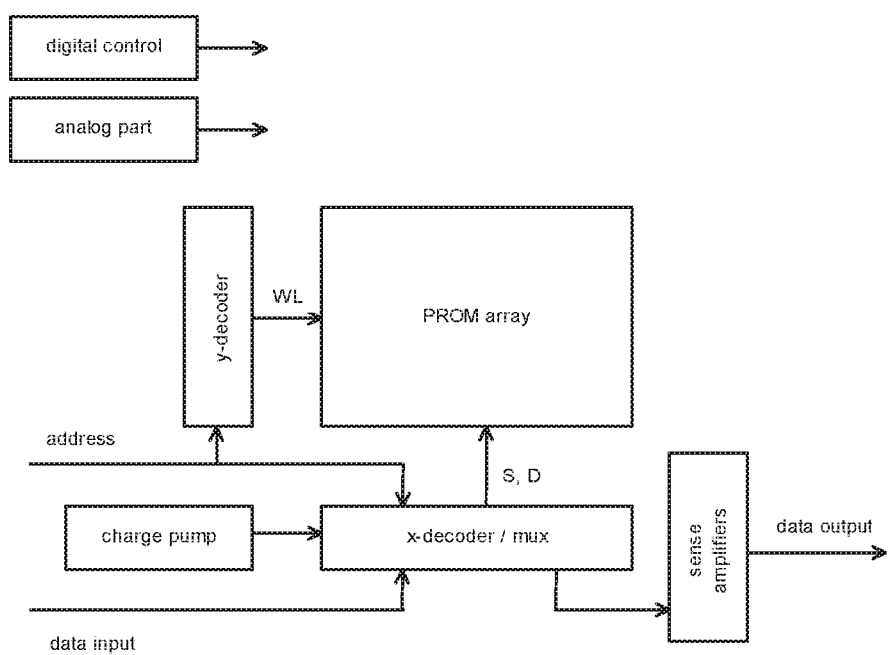
FIG. 7 shows a memory block diagram including some peripheral circuitry.

FIG. 7 shows a memory block diagram including some peripheral circuitry. At the centre of the arrangement is provided a PROM array according to an embodiment. This array may be the array shown in FIG. 6 but preferably is a larger array comprising many thousands of words, select and data lines. The arrangement further comprises digital and analogue blocks configured to coordinate the operation of x- and y-decoders. The y-decoder applies the voltages required on the word lines for selecting individual rows of memory cells for reading of individual memory cells for programming on the basis of addresses of the memory cells to be selected within the array. The x-decoder applies the voltages required on the select and data lines for selecting memory cells for reading or programming on the basis of addresses of the memory cells to be selected within the array. The addresses of the memory cells of interest are provided to the decoders by the digital controller via external inputs. The voltages applied to the common lines D may be boosted to a voltage above the supply voltage Vdd by the charge pump(s) connected to the x-decoder. For sensing a bank of sense amplifiers is connected to the x-decoder. In one embodiment the sense amplifiers monitor the effect conductivity or non-conductivity of the addressed memory cell has on the charging state of the common data line D and, based on an observation of a discharging of the common line or a current flowing through the current line, provides, as an output, an indication that the memory cell investigated has been programmed.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A programmable memory device, the device comprising:
    at least four memory cells, each cell comprising a data storage element connected to a switching element,
    wherein the device is arranged such that each switching element is connected to at least two selection lines for selecting of at least one of the at least four memory cells, at least one of the four memory cells being selectable by applying a voltage to at least one of the at least two selection lines, such that at least two switching elements share one of the at least two selection lines and one of the at least two switching elements shares another one of the at least two selection lines with another switching element and such that each data storage element is connected to a shared data line for applying a programming or reading voltage to each storage element of the at least four memory cells to allow for programming or reading of the selected memory cell.

2. The device of claim 1, wherein two of the at least two selection lines extend in respective first and second directions and wherein the first and second directions are substantially perpendicular.

3. The device of claim 1, wherein the storage element and the switching element define a longitudinal axis, wherein said longitudinal axis extends at an angle relative to the one or more or all of the select lines and the common data line, wherein the angle is an angle other than an integer multiple of 90 degrees.

4. A programmable memory arrangement comprising first and second programmable memory devices according to claim 1 arranged side by side in a first direction, wherein the first and second programmable memory devices share a select line extending in a second direction, wherein the first and second directions are different.

5. A programmable memory arrangement according to claim 4, comprising a third programmable memory device, the third programmable memory device arranged side by side in the second direction with the first programmable memory device, wherein the first and third programmable memory devices share the common data line.

6. A device according to claim 1, further comprising a select voltage source configured to apply voltages to the select lines, wherein the device is arranged to select a memory cell by the select voltage source applying a first voltage to one of the at least two selection lines connected to the switching element of a memory cell to be selected and a second voltage to the other one of the at least two selection lines connected to the switching element of the memory cell to be selected.

7. A device according to claim 6, wherein the select voltage source is configured to apply a third voltage to one of at least two selection lines that is shared by two other switching elements, one of the two other switching elements being arranged to share the other of the at least two selection lines connected to the switching element of the memory cell to be selected.

8. A device according to claim 7, wherein the first voltage is smaller than the second voltage and/or the third voltage is equal to or larger than the second voltage.

9. A device according to claim 6, further comprising a data line voltage source configured to apply a programming or reading voltage to the shared data line.

10. A device according to claim 1, wherein each switching element comprises a transistor, with a gate of the transistor being connected to one of the at least two selection lines and a source of the transistor connected to another of the at least two selection lines.

11. A device according to claim 10, wherein each data storage device comprises a capacitive element connected between the shared data line and a drain of the transistor.

12. A method of programming or reading a programmable memory device, the device comprising at least four memory cells, each cell comprising a data storage element connected to a switching element, wherein the device is arranged such that each switching element is connected to at least two selection lines for selecting of at least one of the at least four memory cells, at least one of the four memory cells being selectable by applying a voltage to at least one of the at least two selection lines, such that at least two switching elements share one of the at least two selection lines and one of the at least two switching elements shares another one of the at least two selection lines with another switching element and such that each data storage element is connected to a shared data line for applying a programming or reading voltage to each storage element of the at least four memory cells to allow for programming or reading of the selected memory cell, the method comprising:

applying a voltage to at least one of the at least two selection lines of the device to select at least one memory cell; and applying a voltage to the shared data line to program or read the selected memory cell.

13. The method of claim 12, wherein two of the at least two selection lines extend in respective first and second directions and wherein the first and second directions are substantially perpendicular.

14. The method of claim 12, wherein the storage element and the switching element define a longitudinal axis, wherein said longitudinal axis extends at an angle relative to the one or more or all of the select lines and the common data line, wherein the angle is an angle other than an integer multiple of 90 degrees.

15. The method of claim 12, wherein the device further comprises a select voltage source configured to apply voltages to the select lines, wherein the device is arranged to select a memory cell by the select voltage source applying a first voltage to one of the at least two selection lines connected to the switching element of a memory cell to be selected and a second voltage to the other one of the at least two selection lines connected to the switching element of the memory cell to be selected.

16. A method according to claim 15, wherein the select voltage source is configured to apply a third voltage to one of at least two selection lines that is shared by two other switching elements, one of the two other switching elements being arranged to share the other of the at least two selection lines connected to the switching element of the memory cell to be selected.

17. A method according to claim 16, wherein the first voltage is smaller than the second voltage and/or the third voltage is equal to or larger than the second voltage.

18. A method according to claim 15, wherein the device further comprises a data line voltage source configured to apply a programming or reading voltage to the shared data line.

19. A method according to claim 12, wherein each switching element comprises a transistor, with a gate of the transistor being connected to one of the at least two selection lines and a source of the transistor connected to another of the at least two selection lines.

20. A method according to claim 19, wherein each data storage device comprises a capacitive element connected between the shared data line and a drain of the transistor.

\* \* \* \* \*